United States Patent
Defretin et al.

(10) Patent No.: US 10,485,107 B2
(45) Date of Patent: Nov. 19, 2019

(54) DOWNHOLE EQUIPMENT USING FLEXIBLE CIRCUITS

(71) Applicant: SCHLUMBERGER TECHNOLOGY CORPORATION, Sugar Land, TX (US)

(72) Inventors: Harmel Defretin, Sugar Land, TX (US); Tao Xu, Houston, TX (US); Glenn Gardner, Cypress, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 15/366,808

(22) Filed: Dec. 1, 2016

(65) Prior Publication Data

US 2018/0160534 A1    Jun. 7, 2018

(51) Int. Cl.
*H05K 1/14* (2006.01)
*H05K 3/36* (2006.01)
*H05K 1/02* (2006.01)
*H05K 3/46* (2006.01)

(52) U.S. Cl.
CPC ............ *H05K 1/147* (2013.01); *H05K 1/148* (2013.01); *H05K 3/363* (2013.01); *H05K 1/028* (2013.01); *H05K 3/4691* (2013.01)

(58) Field of Classification Search
CPC ........ H05K 1/147; H05K 1/148; H05K 3/363; H05K 5/0017; H05K 1/028; H05K 3/4691
USPC ........................................................ 361/749
See application file for complete search history.

(56) References Cited

U.S. PATENT DOCUMENTS

| | | | | |
|---|---|---|---|---|
| 4,513,352 A | * | 4/1985 | Bennett | H05K 7/20336 165/902 |
| 4,812,135 A | * | 3/1989 | Smith | H01B 7/0838 174/117 F |
| 4,894,015 A | | 1/1990 | Stockero et al. | |
| 5,224,023 A | * | 6/1993 | Smith | G06F 1/184 174/254 |
| 5,345,205 A | * | 9/1994 | Kornrumpf | H01L 23/5387 257/E23.177 |
| 5,717,556 A | * | 2/1998 | Yanagida | H05K 1/0278 174/254 |
| 5,917,149 A | * | 6/1999 | Barcley | H05K 1/0281 174/36 |
| 5,936,850 A | * | 8/1999 | Takahashi | G02F 1/13452 361/784 |
| 6,531,662 B1 | * | 3/2003 | Nakamura | H01M 10/4257 174/254 |
| 7,180,736 B2 | * | 2/2007 | Glovatsky | H05K 7/1434 361/688 |

(Continued)

FOREIGN PATENT DOCUMENTS

CN    101990371 B    8/2012

*Primary Examiner* — Andargie M Aychillhum
*Assistant Examiner* — Michael F McAllister

(57) ABSTRACT

Downhole equipment circuitry, comprising: a first substrate member including one or more circuits; a second substrate member including one or more circuits; and a flexible circuit, wherein: the first and second substrate members are separate substrate members; the flexible circuit is of a laminated construction; and the flexible circuit provides electrical communication between the one or more circuits of the first substrate member and the one or more circuits for the second substrate member.

13 Claims, 18 Drawing Sheets

(56) References Cited

U.S. PATENT DOCUMENTS

| | | | | |
|---|---|---|---|---|
| 7,209,361 | B2* | 4/2007 | Berberich | H05K 1/0218 |
| | | | | 174/254 |
| 7,304,373 | B2* | 12/2007 | Taggart | H01L 23/50 |
| | | | | 174/254 |
| 7,503,767 | B2 | 3/2009 | Pai | |
| 7,606,041 | B2* | 10/2009 | Park | H01R 12/52 |
| | | | | 174/254 |
| 8,498,125 | B2* | 7/2013 | Hall | E21B 47/011 |
| | | | | 361/735 |
| 9,523,270 | B2* | 12/2016 | Fripp | E21B 47/011 |
| 9,633,977 | B1* | 4/2017 | We | H01L 25/0655 |
| 9,879,520 | B2* | 1/2018 | Fanini | E21B 47/011 |
| 2014/0265565 | A1* | 9/2014 | Cooley | H02P 6/18 |
| | | | | 307/18 |
| 2014/0291006 | A1* | 10/2014 | Yamamoto | H05K 3/363 |
| | | | | 174/263 |
| 2016/0099227 | A1* | 4/2016 | Dalal | H01L 23/5389 |
| | | | | 257/774 |

\* cited by examiner

DOWNHOLE EQUIPMENT USING FLEXIBLE CIRCUITS

BACKGROUND

Embodiments of the present disclosure relate to downhole equipment circuitry, downhole equipment, and methods of assembling downhole equipment circuitry.

There are numerous environments in which harsh conditions pose difficulties for the designers of electronic systems. These include environments in which there are, for example, high temperatures, high pressures, large shocks, and large amounts of vibration.

Typically, a modern electronic system may comprise a plurality of interconnected circuits. These circuits may include, for example, multi-chip modules (MCMs) in which a plurality of different integrated circuits are provided on a single substrate and/or may include ceramic circuits in which a circuit (such as a printed circuit) is provided on a ceramic substrate (these are particularly useful in harsh environments).

The arrangements of the plurality of interconnected circuits within a device may be driven be a number of different factors, including the available space, and the need to minimise relatively delicate connections between the circuits.

An example of where such arrangement can be found is in downhole equipment used down a borehole (e.g. a borehole for hydrocarbon exploration or extraction). The downhole equipment may be exposed to relatively harsh conditions within the borehole—including high temperatures, high pressures, exposure to large amounts of vibration, and exposure to significant mechanical shock. Downhole equipment also has, by the nature of the borehole, relatively restrictive space/volume requirements.

In some conventional downhole equipment, such circuits have been placed such that they extend along a length of the downhole equipment (i.e. a primary plane the or each circuit is generally parallel to a longitudinal axis of the downhole equipment). This allows the circuits to extend along what has conventionally been the longest length of the downhole equipment. This minimises the number of interconnections between the circuits and places the majority of those interconnections along the same plane. However, recently, there has been a drive to reduce the size (i.e. length) of the downhole equipment. This has reduced the space available for the circuits.

The circuits have also conventionally been linked together by wire harnesses and/or the circuits have been mounted on extensive printed circuit boards (which may then also be linked by wire harnesses). Typically, one or more circuit is mounted to a chassis member of the downhole equipment and such circuits are conventionally linked by a wire harness. Other circuits are mounted on printed circuit boards which are then directly or indirectly mounted to the chassis member.

Wire harnesses and the use of extensive printed circuit boards in the conventional equipment uses yet more valuable space in the equipment and makes the equipment relatively heavy. The wire harnesses are also prone to problems in their reliability and the reliability of their construction. The connection points of the wire harnesses are relative weak points which are prone to failure during the operation life of the equipment. Of course, wire harnesses are also slow to construct and, furthermore, take a relatively long time to install and can be awkward to install in some instances. The use of extensive printed circuit boards limits the amount of space reduction which is possible and can also be prone to failure in harsh environments.

There is a need, therefore, to provide alternative methods of interconnecting circuits, e.g. within downhole equipment.

SUMMARY

Accordingly, an aspect of the present disclosure provides downhole equipment circuitry, comprising: a first substrate member including one or more circuits; a second substrate member including one or more circuits; and a flexible circuit, wherein: the first and second substrate members are separate substrate members; the flexible circuit is of a laminated construction; and the flexible circuit provides electrical communication between the one or more circuits of the first substrate member and the one or more circuits for the second substrate member.

The downhole equipment circuitry may further comprise a first support member and a second support member, wherein the first substrate member may be mounted to the first support member and the second substrate member may be mounted to the second support member.

The flexible circuit may be of a rigid-flexible type such that at least one rigid portion of the flexible circuit may be mounted with respect to the first or second substrate members.

The at least one rigid portion may include a rigid portion mounted on the first or second support member.

The at least one rigid portion may include a rigid portion mounted adjacent the first or second substrate member.

The flexible circuit may be wire bonded to at least one of the first and second substrate members.

The support member may be a wall of a housing.

At least part of the one or more circuits of the first or second substrate members may be substantially sealed.

The first or second substrate member may be a co-fired ceramic material.

Another aspect provides downhole equipment including a housing containing downhole equipment circuitry as above.

The downhole equipment may be a tool.

The first and second substrate members may be mounted in the housing such that each substrate member extends primarily through a different plane to the other substrate member.

Each substrate member may face at least part of the other substrate member.

Another aspect provides a method of assembling downhole equipment circuitry, the method comprising: providing a first substrate member including one or more circuits; providing a second substrate member including one or more circuits; connecting a flexible circuit to provide electrical communication between the one or more circuits of the first substrate member and the one or more circuits for the second substrate member, wherein the first and second substrate members are separate substrate members and the flexible circuit is of a laminated construction.

The method may further comprise testing the circuitry after connecting the flexible circuit.

The method may further comprise mounting the first and second substrate members in a housing.

The step of mounting the first and second substrate members in the housing may include mounting the substrate members such that each substrate member extends primarily through a different plane to the other substrate member.

The step of mounting the first and second substrate members in the housing may include mounting the substrate members such that each substrate member faces at least part of the other substrate member.

BRIEF DESCRIPTION OF THE DRAWINGS

Embodiments of the present disclosure are described, by way of example only, with reference to the accompanying drawings, in which.

DETAILED DESCRIPTION

Figure 1:
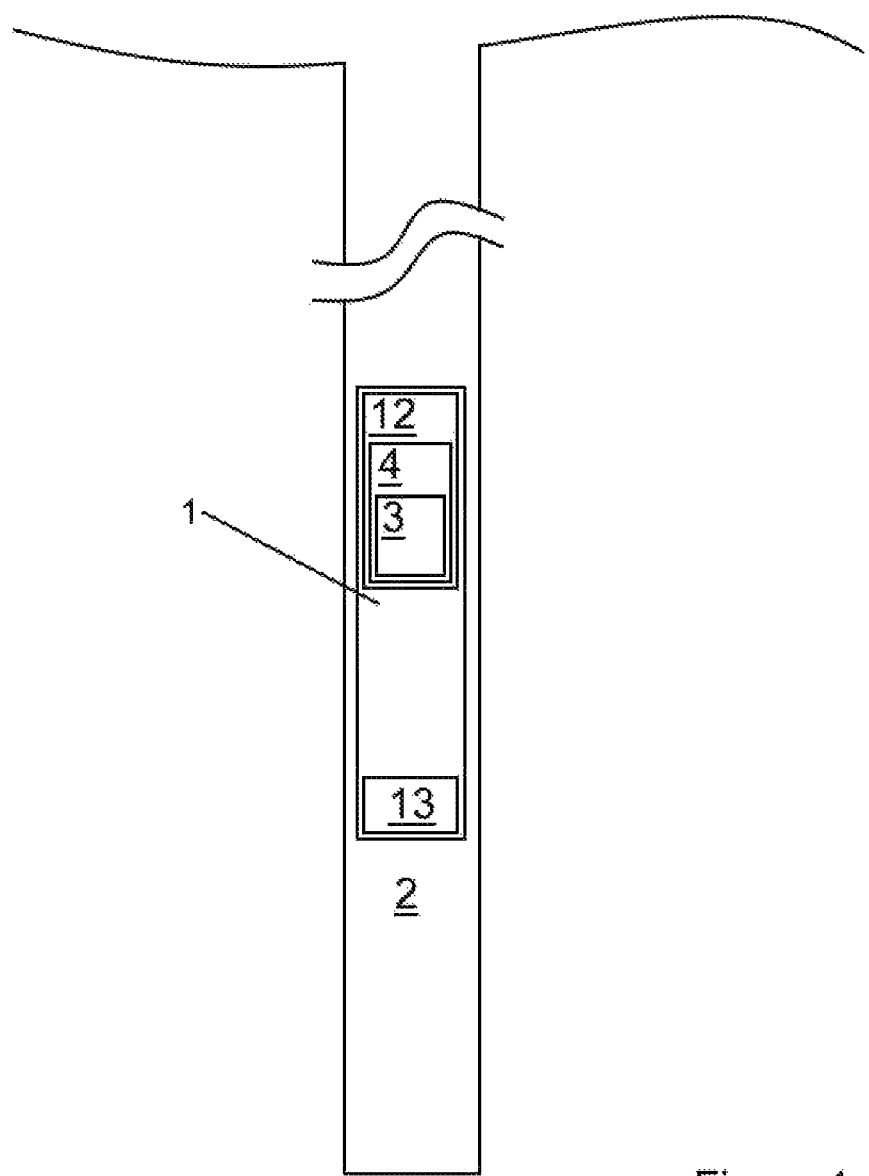
FIG. 1 shows downhole equipment according to some embodiments.

Embodiments of the present disclosure include downhole equipment 1 which is configured to be used in a borehole 2 (see FIG. 1, for example). The borehole 2 may be a borehole 2 used in hydrocarbon exploration or extraction, for example, or could be a borehole used in water extraction or carbon capture and/or storage.

The downhole equipment 1 may take a number of different forms but, in general, is configured to be positioned in the borehole 2 and used in an operation associated with that borehole 2. The downhole equipment 1 may, for example, form part of a drill string 11 which may include one or more tools 12 such as motors and/or a drill bit 13.

Figure 2:
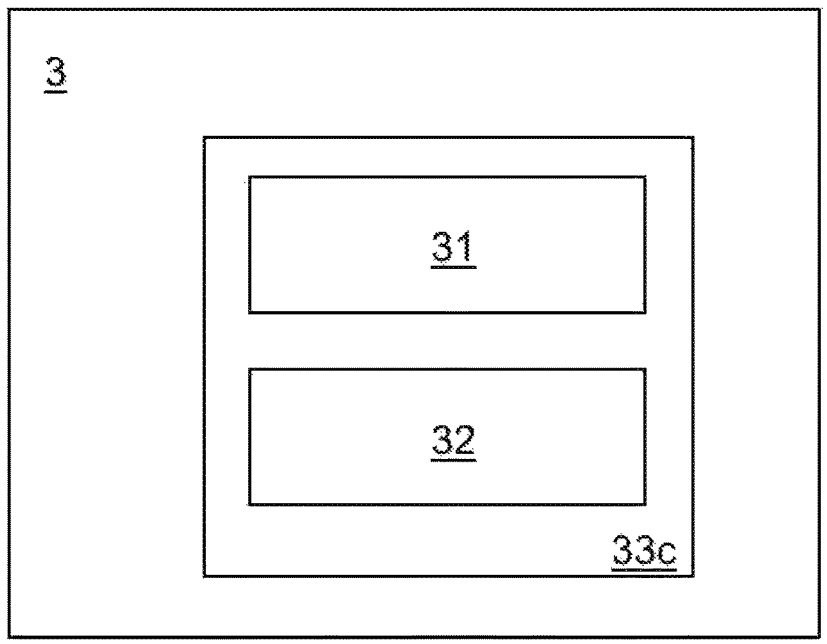
FIGS. 2-4 shows circuitry according to some embodiments.
Figure 3:
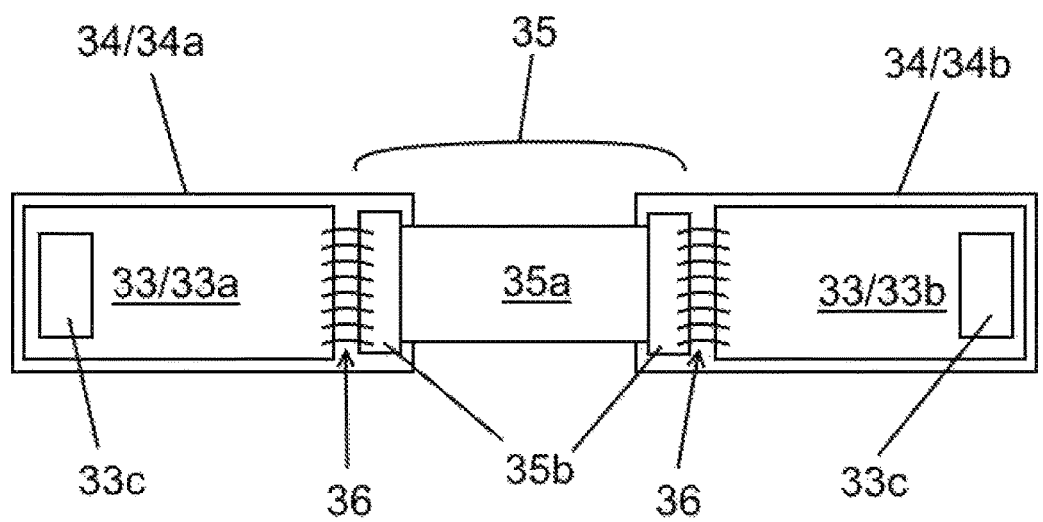
Figure 4:
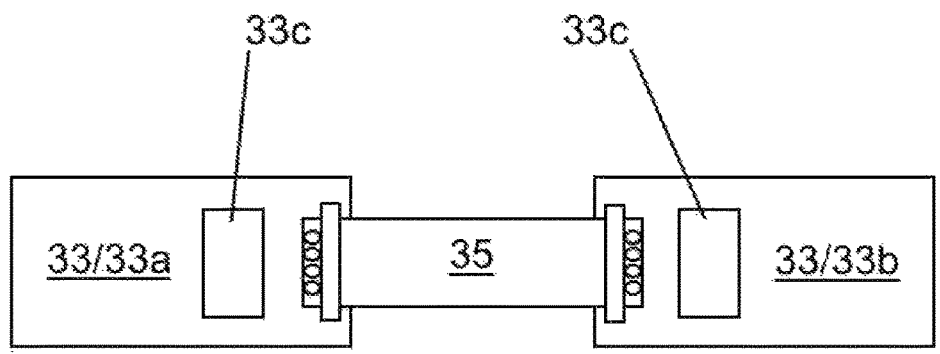
Figure 5:
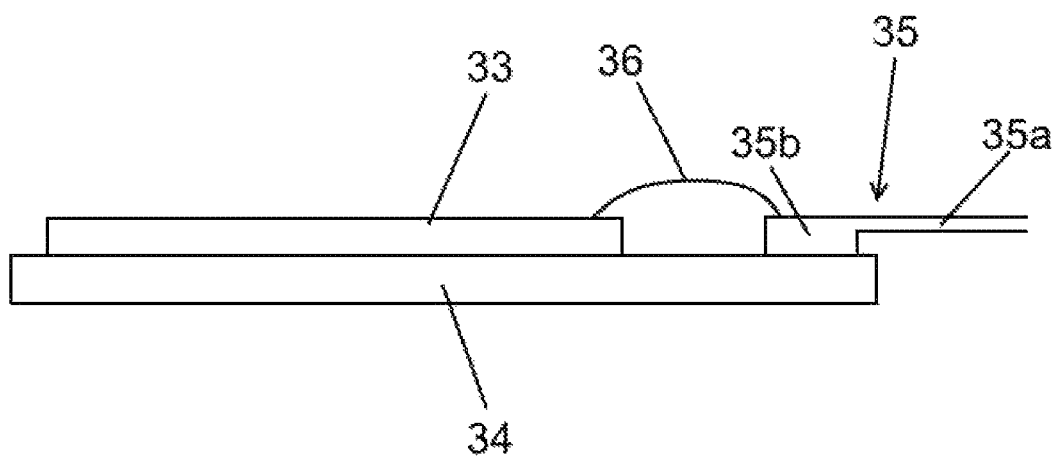
FIG. 5 shows a support member, substrate member and part of a flexible circuit according to some embodiments.

The downhole equipment 1 includes circuitry 3 (see FIGS. 1 and 2, for example) which may include one or more control circuits 31 which are configured to control the operation of one or more aspects of the downhole equipment 1 and/or may include one or more sensor circuits 32 configured to sense one or more parameters associated with the downhole equipment 1.

The circuitry 3 may, for example, form part of the one or more tools 12 or may form part of the drill bit 13.

The circuitry 3 includes two or more separate substrate members 33 (see FIGS. 3, 4, and 9-15, for example). In this sense, the substrate members 31 are separate because the two or more substrate members 33 are not integrally formed or physically mounted to each other. The two or more separate substrate members 33 include a first substrate member 33a and a second substrate member 33b.

The two or more substrate members 33 each include one or more circuits 33c, which may be integrated circuits 33c. The one or more circuits 33c, as will be appreciated, from part of the circuitry 3 and may provide at least part of the one or more sensor circuits or control circuits 31, 32. In some embodiments, each substrate 33 is a multi-chip module (MCM).

The two or more substrate members 33 may be made of a different material to each other. Accordingly, each substrate member 33 may be formed from a ceramic material. In some embodiments, the material forming each substrate member 33 and the associated one or more circuits 33c is a co-fired ceramic material such as a high-temperature co-fired ceramic material (HTCC) or a low-temperature co-fired ceramic material (LTCC). In some embodiments, each substrate member 33 may be formed from a direct bonded copper (DBC) or from an active metal braze (AMB) process.

In some embodiments, each substrate member 33 is mounted on a respective support member 34 (see FIGS. 3, 5, 9, 11, 12, and 15, for example). In some embodiments, the first substrate member 33a is, therefore, mounted on a first support member 34a and the second substrate member 33b is mounted on a second support member 34b.

In some embodiments including more than two substrate members 33, there may be two substrate members 33 mounted to the same support member 34 but, in such embodiments, at least one other substrate member 33 is not mounted to that same support member 34 (and may be mounted to its own support member 34).

Each support member 34 may be formed from a different material to another of the support members 34. Accordingly, each support member 34 may be formed from a material such as an iron-nickel-cobalt alloy material (such as Kovar), titanium, stainless steel, or a nickel chromium material (such as Inconel). The support members 34 are configured to provide support for the substrate member(s) 33 mounted thereon.

In some such embodiments, the substrate member 33 or members 33 are adhered to the support member 34 using an adhesive. In some embodiments, the substrate member 33 or members 33 are soldered, brazed, or welded to the support member 34. The use of an adhesive may be particularly convenient when the substrate member 33 or members 33 are one-sided (i.e. the one or more circuits 33c of the substrate member 33 or members 33 are provided on a single side of the substrate member 33 or members 33 only). The use of soldering, brazing or welding may be particularly convenient when the substrate member 33 or members 33 are two sided (i.e. the one or more circuits 33c of the substrate member 33 or members 33 are provided on both sides of the substrate member 33 or members 33, including the side which is adjacent the support member 34).

In some embodiments, a flexible circuit 35 is provided, e.g. as part of the circuitry 3. The flexible circuit 35 is configured to provide electrical communication between the at least two substrate members 33. Accordingly, the flexible circuit 35 may be configured to interconnect the one or more circuits 33c provided on the first and second substrate members 33a, 33b.

In embodiments in which there are more than two substrate members 33, there may be more than one flexible circuit 35 provided to interconnect the substrate members 33. As will be appreciated, however, in such embodiments, a particular substrate member 33 may be connected in electrical communication with another substrate member 33 via a further (i.e. third) substrate member 33 and two flexible circuits 35—rather than a flexible circuit 35 being provided to provide direct connection between all substrate members 33 (although this is a possibility in some embodiments). In this context, "direct" means not via another substrate member 33.

The flexible circuit 35 between the first and second substrate members 33 may be of the rigid-flexible type (see FIGS. 3, 5, 6, 9, 11, 12, and 15, for example). A flexible circuit 35 of the rigid-flexible type is a flexible circuit 35 comprising a flexible portion 35*a* and at least one rigid portion 35*b*. This type of circuit may be referred to as a rigid-flex circuit.

Figure 6:
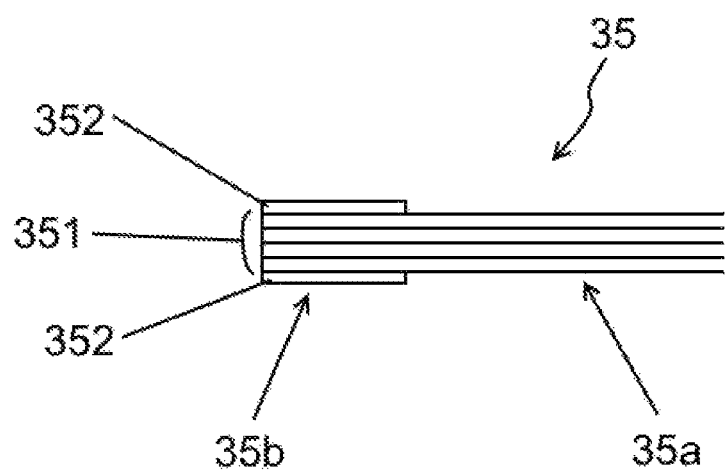
FIG. 6 show a schematic view of part of a flexible circuit of the rigid-flexible type.
Figure 7:
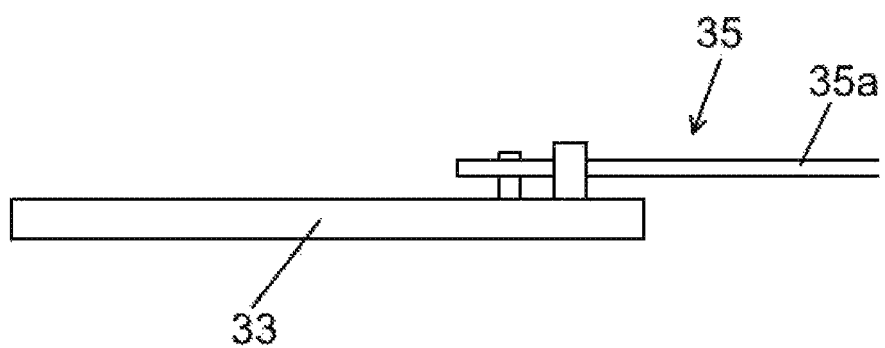
FIG. 7 shows a substrate member and part of a flexible circuit according to some embodiments.
Figure 8:
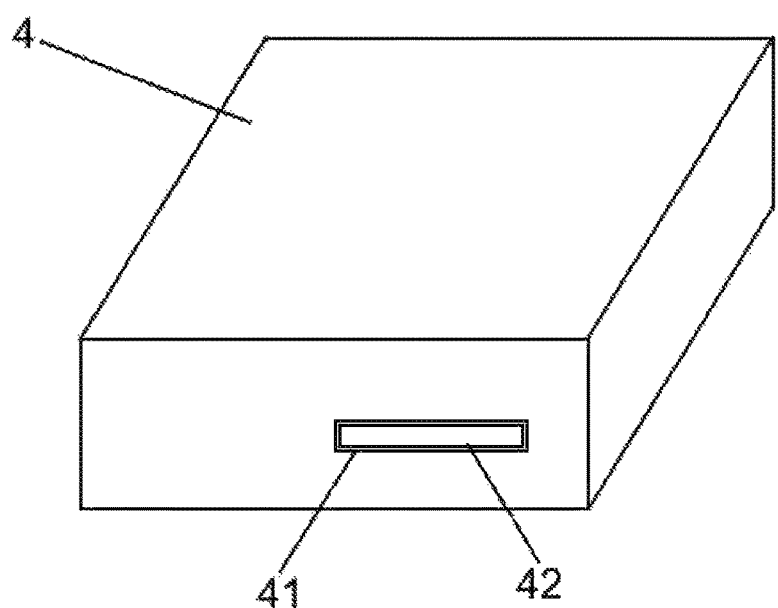
FIG. 8 shows a housing of some embodiments.
Figure 9:
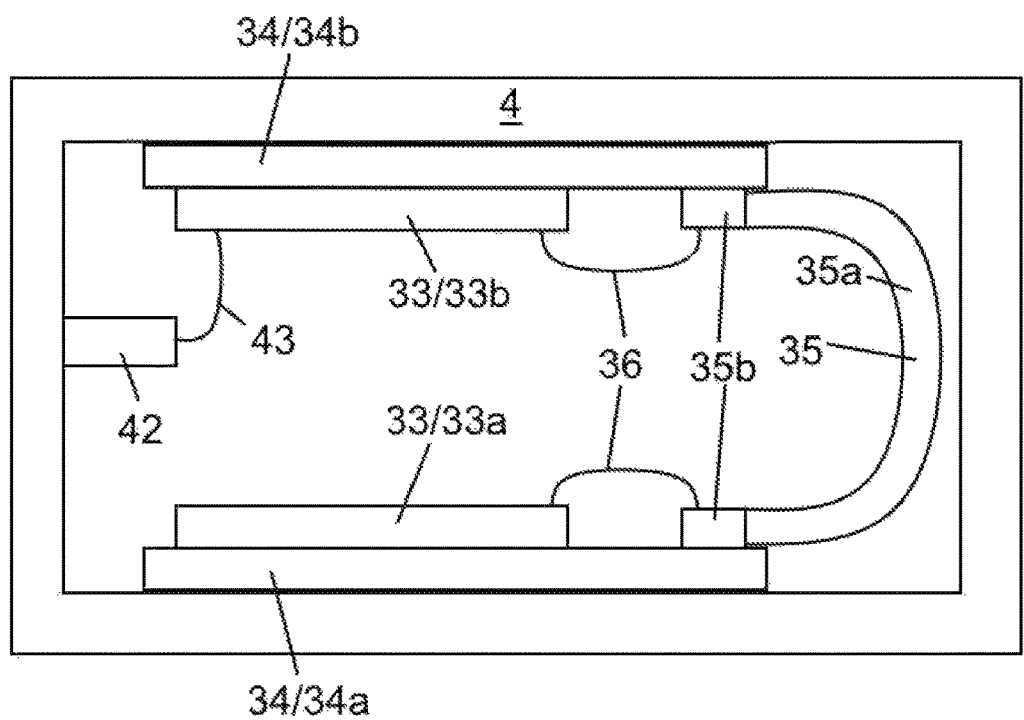
FIGS. 9-11 show views of circuitry mounted within housings according to some embodiments.
Figure 10:
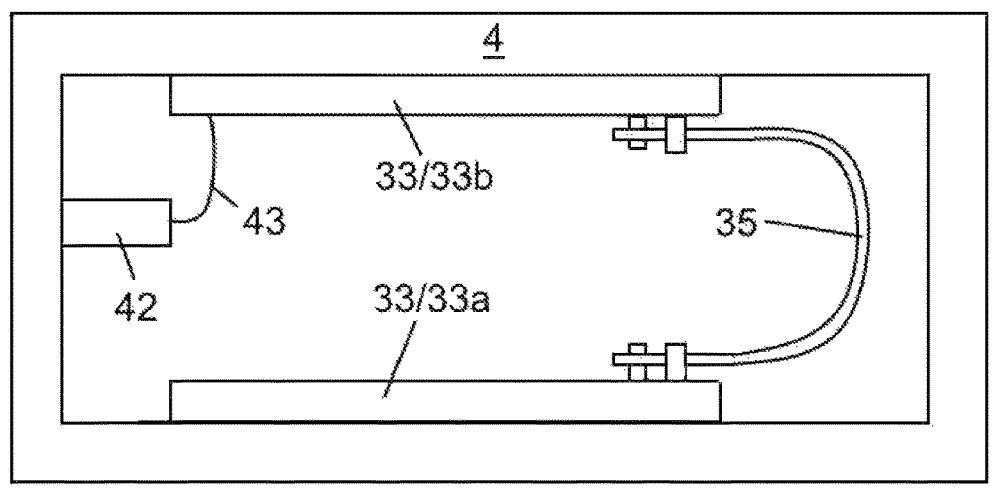
Figure 11:
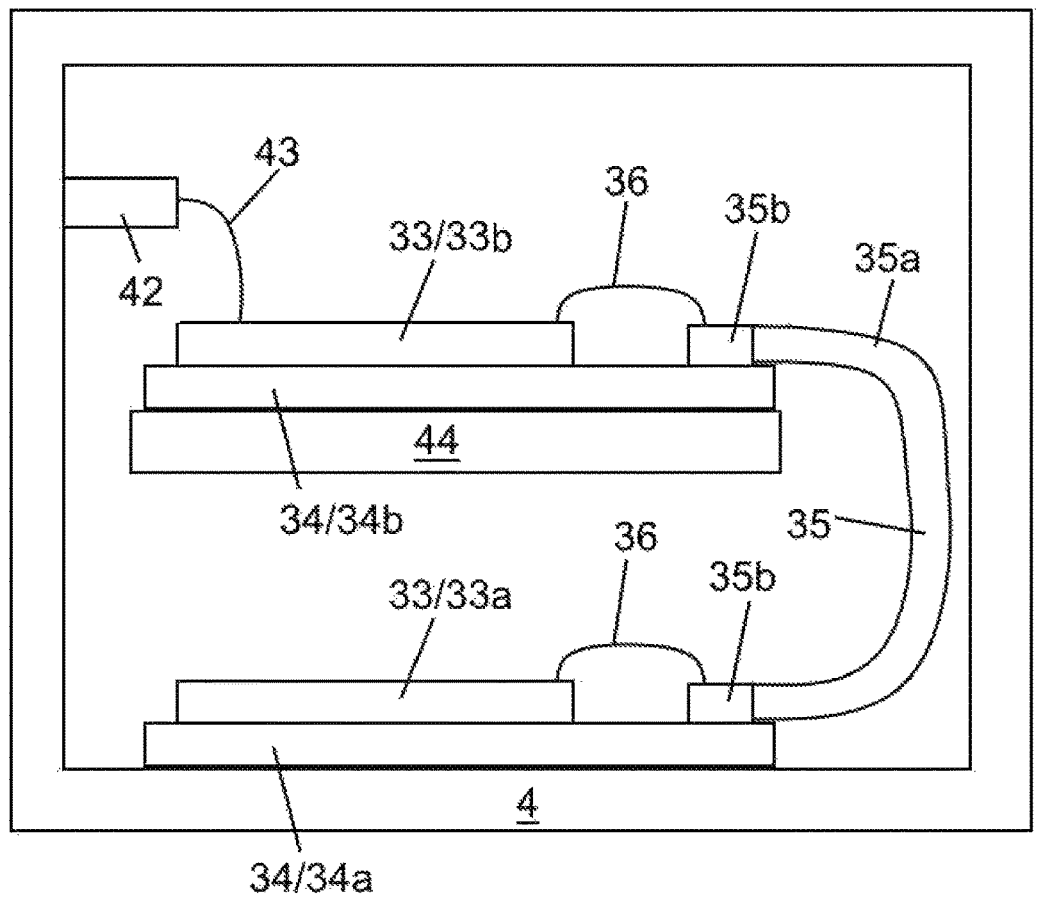
Figure 12:
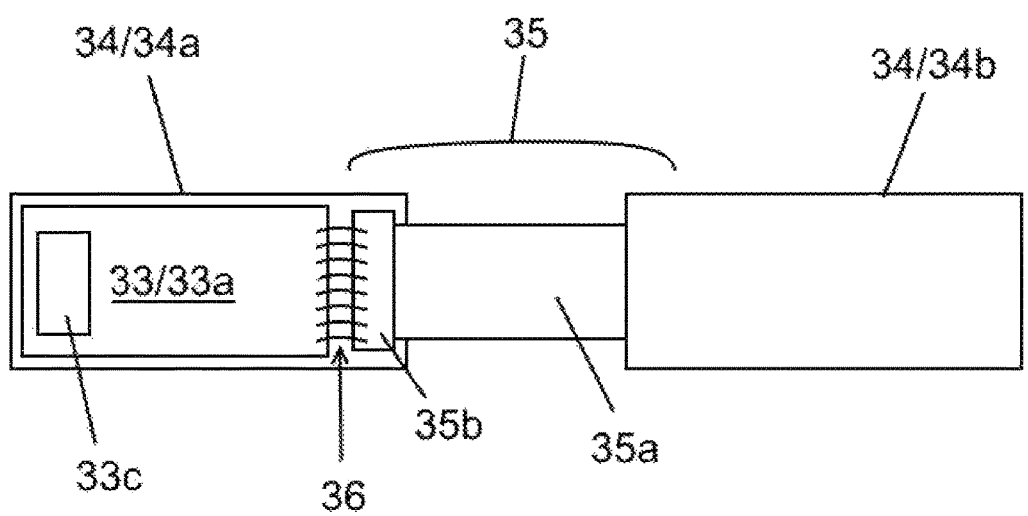
FIG. 12, shows circuitry according to some embodiments.
Figure 13:
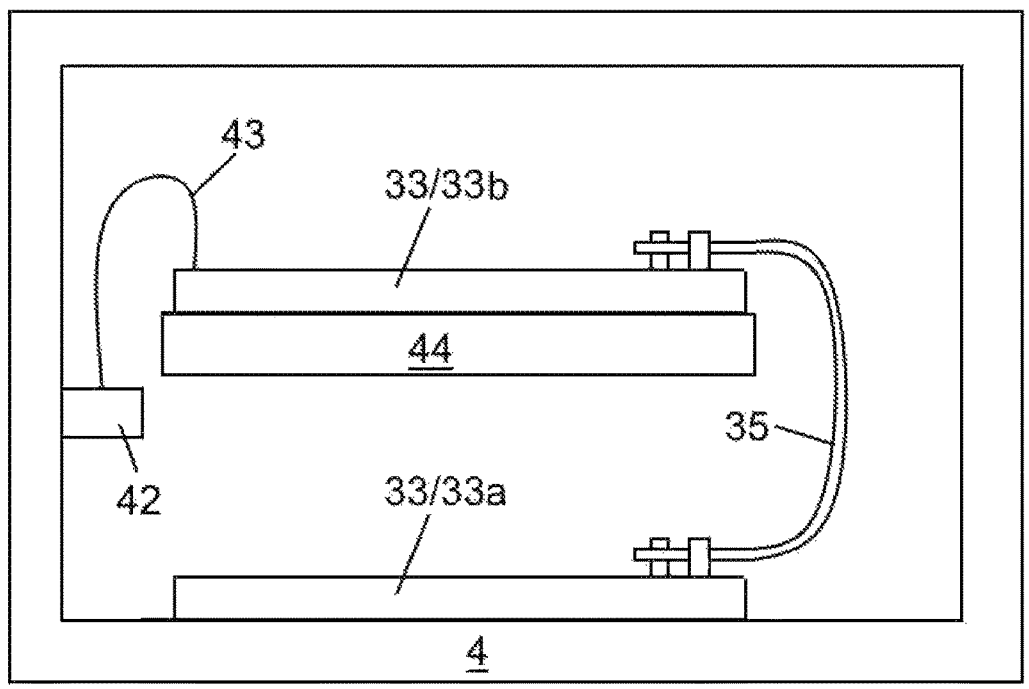
FIG. 13 shows circuitry mounted within a housing according to some embodiments.
Figure 14:
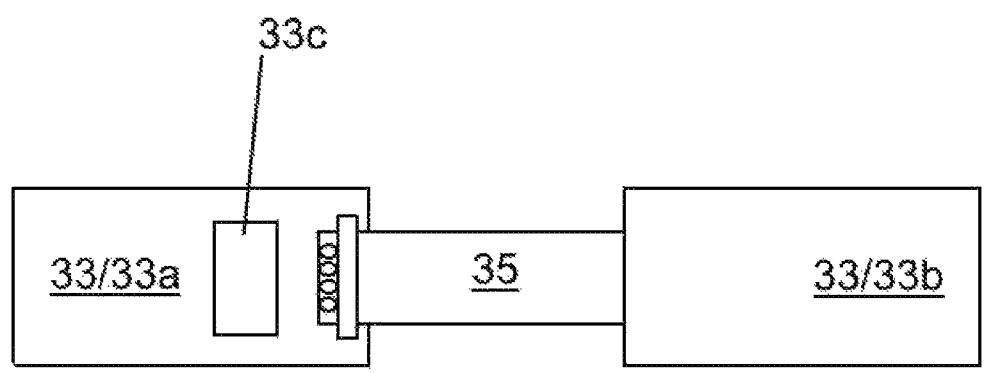
FIG. 14 shows circuitry according to some embodiments.

With reference to FIG. 6, for example, a flexible circuit 35 of the rigid-flexible type may comprise a laminated construction (i.e. a plurality of layers which are bonded (e.g. adhered) together to form the flexible circuit 35, wherein at least one layer may provide a different property or function from at least one other layer). The laminated construction may include a plurality of flexible layers 351 extending through the flexible portion 35*a* and the or each rigid portion 35*b*, and one or more rigid layers 352 extending through the rigid portion 35*b* (or portions 35*b*) but not the flexible portion 35*a*. In some embodiments, the flexible layers 351 and rigid layers 352 are adhered together. Electrically conductive elements may extend through the flexible and rigid portions 35*a, b* in order to provide the circuit of the flexible circuit 35 (i.e. the path for the electrical communication through the flexible circuit 35). The or each rigid layer 352 may be provided at or towards one or more end sections of the flexible circuit 35. The or each rigid layer 352 may be a respective outer layer of the laminated construction in the rigid portion 35*b*.

In some embodiments, the flexible layers 351 include at least one polymer layer on which is provided, or laid, at least one track of conductive material forming an electrically conductive element. The or each track may be in the form of a film or foil of a metal or metal alloy (such as copper or a copper alloy). In some embodiments the or each track may be provided by a conductive ink printed onto a flexible layer 351 (such as a silver and/or carbon polymer thick-film ink). The outer surfaces of at least the flexible portion 35*a* of the flexible circuit 35 may be covered in a protective layer—which may be one of the flexible layers 351—which may be formed from an electrically insulating material. The protective layer may be a layer which is adhered to another of the flexible layers 351 or a coating which it applied to another of the flexible layers 351.

The flexible layers 351 may include adhesive which is used to adhere one flexible layer 351 to another (and/or which may be used to adhere the electrically conductive element(s) to another of the flexible layers 351).

In embodiments in which the flexible circuit 35 is of the rigid-flexible type, the flexible circuit 35 may be mounted to one or more of the support members 34 at the rigid portion 35*b* or rigid portions 35*b*. In particular, the flexible circuit 35 may be adhered, soldered, or brazed onto the support member 34 or members 34 to which it is mounted.

The mounting of the rigid portion 35*b* with respect to one of the support members 34 may be at a location which is spaced apart from the location at which the substrate member 33 is mounted to the support member 34.

In some embodiments, the flexible circuit 35 may be mounted directly to the substrate member 33 rather than to the support member 34. Again, it may be the rigid portion 35*b* of the flexible circuit 35 which is mounted to the substrate member 33 and the flexible circuit 35 may be adhered, soldered, or brazed onto the substrate member 33.

Electrical communication between the substrate member 33 and the flexible circuit 35 (of the rigid-flexible type)—both mounted to the same support member 34—may be provided by one or more electrical conductors 36 such as wires. These may be soldered, for example, to both the substrate member 33 and the rigid portion 35*b* of the flexible circuit 35. To enable the one or more electrical conductors 36 to be secured to the flexible circuit 35, the flexible circuit 35 (e.g. in the rigid portion 35*b*) may include one or more pads which are compatible with gold, aluminium, and/or copper wire bonding. The flexible circuit 35 and substrate member 33 may, therefore, be wire bonded together.

In some embodiments (see FIGS. 4, 7, 10, 13, and 14, for example), the flexible circuit 35 is of a flexible type such that the flexible circuit 35 does not include the rigid portion 35*b* discussed above in relation to the rigid-flexible type—but otherwise may be of the same laminated construction discussed above.

The flexible circuit 35 of the flexible type may be mounted to the substrate member 33 or members 33. In some embodiments, the flexible circuit 35 may be soldered or adhered onto the substrate member 33 or members 33. In some embodiments, the flexible circuit 35 is clamped to the substrate member 33 or members 33.

The flexible circuit 35 may, therefore, form a ribbon—i.e. a strip of relatively thin form compared to its width and length.

In some embodiments the flexible circuit 35 includes one or more electronic components mounted along its length and forming an electrical circuit of the flexible circuit 35. The one or more electronic components may include one or more resistors, capacitors, integrated circuits, transistors, logic gates, diodes, and the like.

The circuitry 3 (including at least two substrate members 33) may be mounted in a housing 4 (see FIGS. 8, 9, 10, 11, 13, and 15, for example). The housing 4 may be in the form of a box or other enclosure in which the circuitry 3 may be contained. In some embodiments, the housing 4 is substantially water-tight.

The housing 4 may define one or more apertures 41 through which one or more electrical connectors 42 may be provided. The or each electrical connector 42 may be connected in electrical communication with the circuitry 3. Accordingly, the or each electrical connector 42 may be connected to the circuitry 3 (e.g. to one or more substrate members 33) via one or more electrical conductors 43 (e.g. wires).

In some embodiments, the or each support member 34 may form part of the housing 4 and may be a wall thereof. The housing 4 may be formed from metal or plastic, for example. In some embodiments, the housing 4 includes one or more internal shelves 44. In some embodiments, the or each support member 34 may be at least part of a respective internal shelf 44 of the housing 4.

In some embodiments, there may be two or more support members 34 on each of which there is mounted at least one substrate member 33. The or each substrate member 33 is mounted to a first side of its respective support member 34 (a second side of each support member 34 may oppose the first side across a depth of the support member 34). Accordingly, in some embodiments, the flexible circuit 35 is also mounted to the first sides of the support members 34.

The arrangement of the two or more support members 34 may be such that the first sides thereof face in substantially the same direction with the two or more support members 34 arranged generally in the same plane (see FIGS. 3, 4, 9, 10 and 16 for example).

The two or more support members 34 may then be mounted to the housing 4 with the second sides of the support members 34 secured to the housing 4. In some embodiments, a first of the two or more support members 34 is mounted to one wall of the housing 4 (e.g. an inner surface of that wall) and a second of the two or more support members 34 may be mounted to another wall of the housing 4 (e.g. an inner surface of that other wall). The wall and other wall of the housing 4 may oppose each other across a portion of the housing 4—e.g. with the substrate members 33 facing each other across a portion of the housing 4. The flexible circuit 35 may, in such embodiments, loop or partial loop between the two (or more) support members 34.

Figure 15:
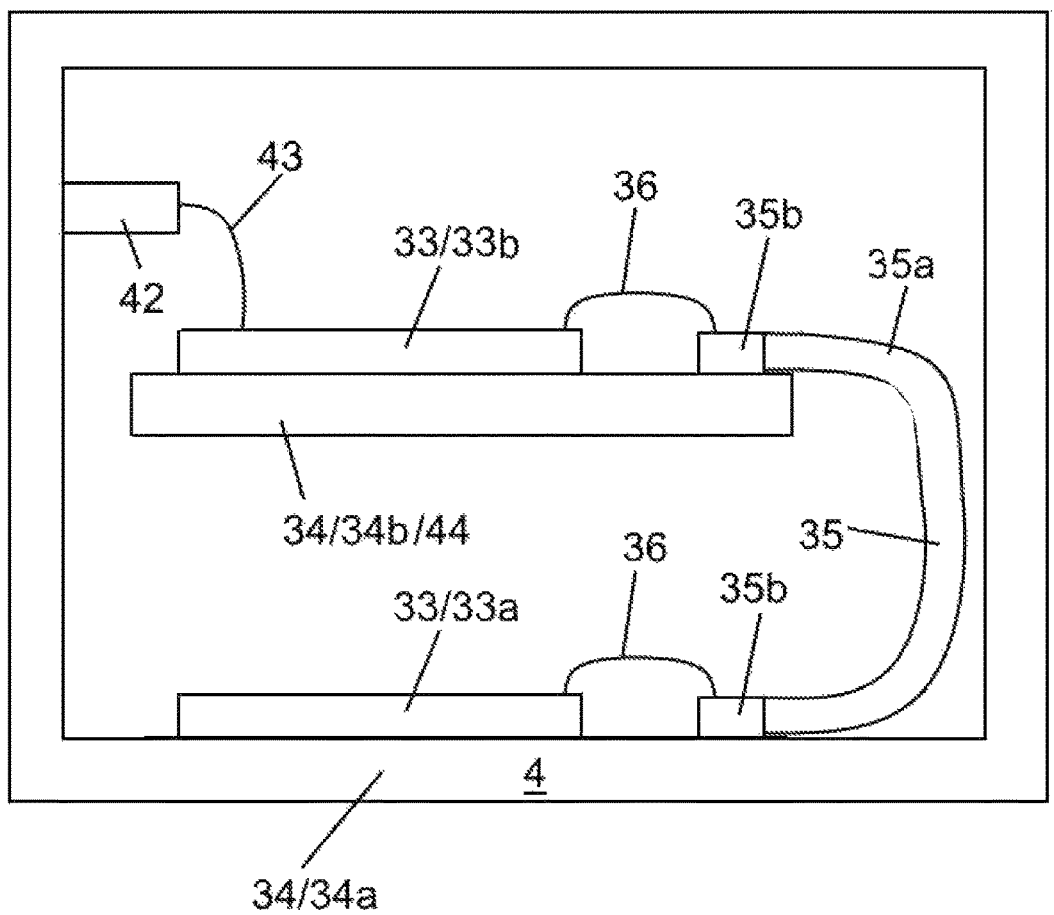
FIG. 15 shows circuitry mounted within a housing according to some embodiments.

A similar arrangement is also possible in embodiments in which support members 34 are not provided, but with the substrate members 33 mounted to the walls of the housing 4 (see FIG. 15, for example). Again, the flexible circuit 35 may loop between two substrate members 33. In such embodiments, the substrate members 33 may configured such that the flexible circuit 35 is mounted to the substrate members 33 on the same side of each member 33 and these two sides then oppose each other when the substrate members 33 are mounted to the housing 4.

In some embodiments, at least part of the circuitry 3 as provided by the substrate members 33 may be sealed by a sealant material to protect against environmental conditions (e.g. exposure to moisture). This may include surrounding at least part of the circuitry 3 on a resin material and/or a sub-housing (e.g. of metal or plastic). A further discussion is presented below in this regard in relation to a substrate mounted housing 37 which may be used in some embodiments.

In some embodiments, the orientation of one of the substrate members 33 with respect to another of the substrate members 33 connected by the flexible circuit 35 is opposite (see FIGS. 11, 12, 13, 14, and 15, for example). In such embodiments, the side of a first of the substrate members 33 to which the flexible circuit 35 is mounted may be different to the side of a second substrate member 33 to which the flexible circuit 35 is mounted. Accordingly, the sides of the substrate members 33 which are to be adjacent the parts of the housing 4 to which they are to be secured may face opposing directions when the two substrate members 33 and flexible circuit 35 are positioned in the same plane. Such an arrangement is also possible in embodiments in which one or more support members 34 are provided—the sides of the support members 34 to which the substrate members 33 are mounted by face different directions when laid out in one plane. Such embodiments, may be useful in positioning one or more of the substrate members 33 on the internal shelf 44.

As will be understood, the or each internal shelf 44 may be configured to support a support member 34 or substrate member 33. In some embodiments, the or each internal shelf 44 forms a rail which provides partial support for a support member 34 or substrate member 33 (which may be configured, for example, to extend between two or more rails).

Embodiments include methods of assembling circuitry 3 of embodiments in housings 4 of embodiments. Accordingly, in some embodiments, the method may comprise securing (i.e. mounting) two or more substrate members 33 to at least two support members 34 (each support member 33 carrying at least one substrate member 33). Once mounted, the substrate members 33 may be connected in electrical communication with the flexible circuit 35 (or flexible circuits 35). Testing may then be performed to determine the correct operation or likely operation of the resulting circuitry 3. The substrate members 33, support members 34, and flexible circuit 35 may then be mounted within the housing 4 as described above. The circuitry 3 may then be retested (although the retesting may include the use of test not previously used in the earlier test or may include the one or more of the same tests).

In embodiments in which the support members 34 are not provided, then the method of assembly may be substantially identical—except for the mounting of the substrate members 33 to the support members 34 and with the substrate members 33 being mounted to the housing 4.

The securing or mounting of the substrate members 33 and/or the support members 34 to the housing 4 may include soldering, brazing, frame welding, post welding, or using an adhesive.

As will be understood, embodiments of the present disclosure may permit two substrate members 33 which extend primarily through respective planes to be mounted in or with respect to a housing 4 (or the item to which they are fitted) such that the planes through which the two substrate members 33 primarily extend are offset from each other (i.e. spaced apart). In some embodiments, the two substrate members 33 may face or oppose each other (at least partially); in some embodiments, the two substrate members 33 may face in generally the same direction as each other; in some embodiments, the two substrate members 33 may face directions which are generally perpendicular to each other.

Once formed, the circuitry 3 may be mounted in a number of different items of equipment—with or without the housing 4. This may include downhole equipment 1, for example.

Embodiments of the present disclosure may, therefore, permit a stack of substrate members 33 to be provided, linked by flexible circuits 35. This may allow, for example, the circuitry 3 to be arranged within the downhole equipment 1 such that a main plane of the circuitry 3 is generally perpendicular to the longitudinal axis of the downhole equipment 1. This may allow smaller downhole equipment to be designed and made. The use of flexible circuits 35 in accordance with some embodiments, seeks to overcome some of the prior issues with wire harnesses and the like in the harsh conditions to which downhole equipment is often exposed.

Figure 16:
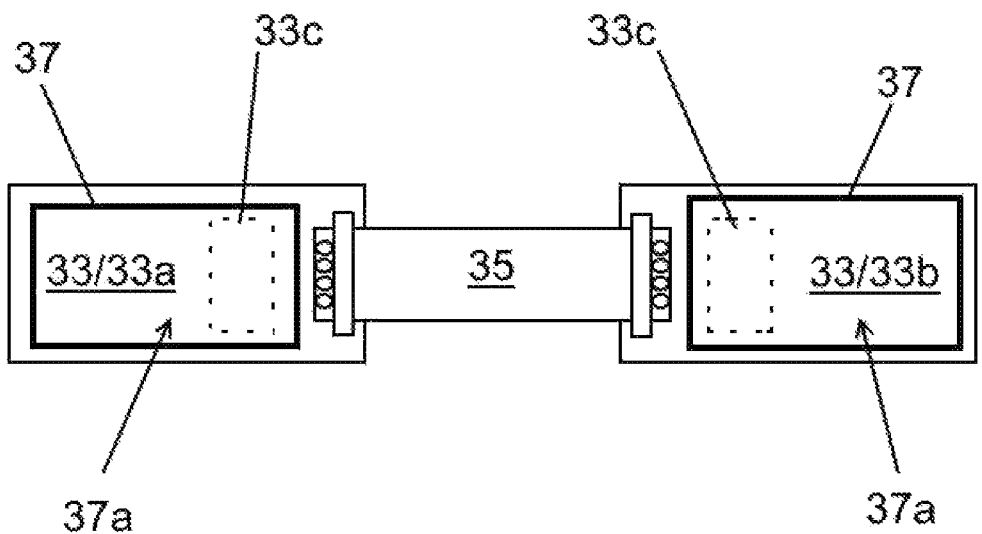
FIGS. 16-18 show views of circuitry according to some embodiments including a substrate mounted enclosure.
Figure 17:
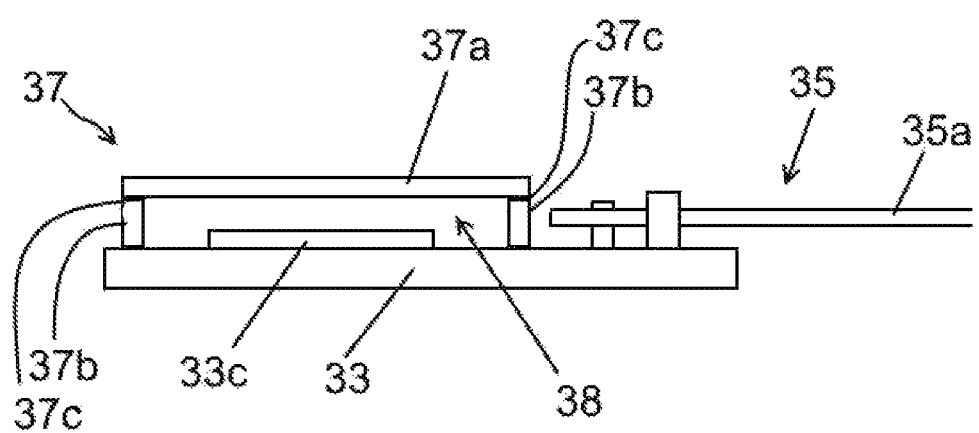
Figure 18:
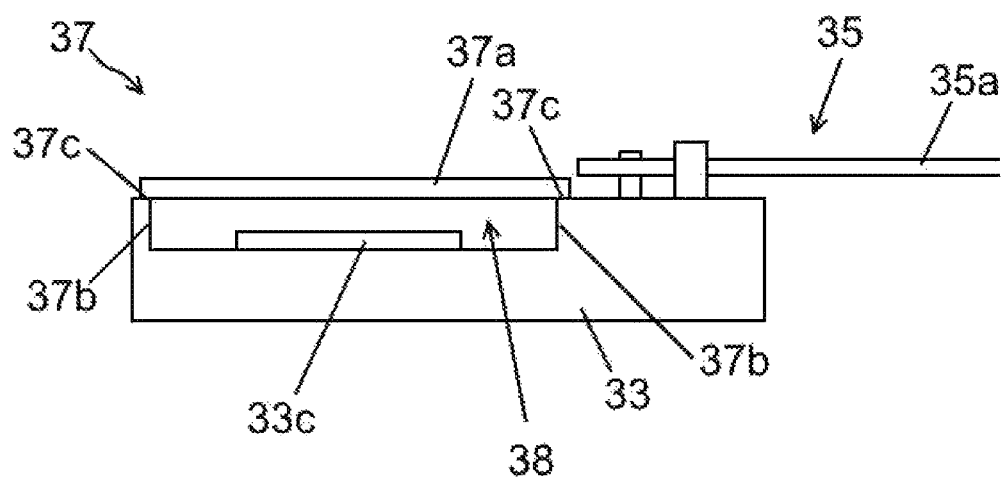

In some embodiments, a substrate mounted enclosure 37 is provided which at least partially encloses the one or more circuits 33c provided on that substrate member 33—see FIGS. 16-18 for example.

The substrate mounted enclosure 37 is secured to the substrate member 33 and at least partially defines an enclosure volume 38 (the enclosure volume 38 may also be at least partially defined by the substrate member 33). The one or more circuits 33 may be provided within the enclosure volume 38 and the substrate mounted enclosure 37 may, therefore, provide additional or alternative protection for the one or more circuits 33c. This protection may be protection from physical shocks and/or from electromagnetic interference and/or heat and/or the ingress of water or other contaminants and/or another environmental condition. Therefore, the substrate mounted enclosure 37 may include shielding material which is configured to insulate the enclosure volume 38 from one or more such environmental condition.

In some embodiments, the enclosure volume 38 may be at least partially filled with sealant material which may be in the form of a gel or paste which is configured to provide further protection from one or more such environmental conditions.

In some embodiments, the enclosure 37 includes at least one enclosure wall 37b. The at least one enclosure wall 37b is configured to provide support for an enclosure lid 37a. The at least one enclosure wall 37b may define a perimeter of the enclosure 37. In some embodiments, the at least one enclosure wall 37b defines a rectangular, square, circular, elliptical, or triangular perimeter of the enclosure 37. The or each enclosure wall 37b may be formed from wall member which is secured to the substrate member 33—e.g. by an adhesive or solder or welding or brazing or glass frit bonding, or the like (see FIG. 16 for example).

In some embodiments, the or each enclosure wall 37b is formed from the substrate member 33 itself (see FIG. 17 for example). In such embodiments, the or each enclosure wall 37b may protrude from a main surface of the substrate member 33 or may be an internal wall which at least partially defines a recess within the substrate member 33.

In some embodiments, a mixture of different types of enclosure wall 37b may be provided (e.g. with one or more being formed from the substrate member 33 and one or more being a wall member secured to the substrate member 33).

The enclosure lid 37a may be secured to the or each enclosure wall 37b (e.g. by use of an adhesive, one or more attachment members (such as a threaded member), or solder, or welding, or brazing, or glass frit bonding, or the like.

In some embodiments, one or more enclosure seals 37c may be provided. The one or more enclosure seals 37c may be provided between respective enclosure walls 37b and the enclosure lid 37a to substantially seal the enclosure volume 38 from the ingress of a fluid (e.g. a liquid) through the join between the enclosure wall(s) 37b and enclosure lid 37a.

In some embodiments, the or each enclosure seal 37c may be formed from a rubber or synthetic rubber or a plastics material. In some embodiments, the or each enclosure wall 37b also acts as the or each enclosure seal 37c (i.e. the or each enclosure seal 37c may be integrally formed with the or each enclosure wall 37b).

In some embodiments, one or more similar enclosure seals 37c are provided in relation to the joint between the or each enclosure wall 37b and the substrate member 33—to provide a similar seal inhibiting or substantially preventing the ingress of fluid (e.g. liquid such as water and/or other contaminants through the joint).

In some embodiments, a seal to prevent or substantially inhibit the ingress of water and/or one or more other contaminants may be provided without the need for the enclosure seal 37c of some other embodiments. In such embodiments, a seal may be provided by a close fit of the enclosure wall 37b with respect to the substrate member 33 and/or the arrangement used to secure the enclosure wall 37b to the substrate member 33. Similarly, in such embodiments, a seal may be provided by a close fit of the enclosure lid 37a with respect to the enclosure wall 37a and/or the arrangement used to secure the enclosure wall 37b to the enclosure lid 37a. The seal may, therefore, be described as a hermetic seal or substantially hermetic seal according to some embodiments.

In some embodiments, the one or more electrical conductors 36 may extend through, over, or under an enclosure wall 37b of the substrate mounted enclosure 37 or through or under an enclosure lid 37a of the substrate mounted enclosure 37.

Accordingly, some embodiments may provide additional or alternative protection for the one or more circuits 33. The use of a substrate mounted enclosure 37 may be applied to any of the embodiments described herein.

In some embodiments, the substrate mounted enclosure 37 is provided before the substrate members 33 are stacked (as described herein).

As will be appreciated, two substrate members 33 linked by the flexible circuit 35 need not both be of the same construction—e.g. one may have a substrate mounted enclosure and one may not. In some embodiments, when provided as a stack of substrate members 33, the substrate mounted enclosure 37 of one substrate member 33 may even be secured to the substrate mounted enclosure 37 of another substrate member 33. In such embodiments, one substrate mounted enclosure 37 may provide one or more of the enclosure walls 37b and/or enclosure lid 37a of the other substrate mounted enclosure 37 (indeed, the two substrate members 33 may effectively provide the enclosure lids 37a for each other's substrate mounted enclosures 37). Therefore, in some embodiments, the substrate mounted enclosures 37 are formed by the stacking process.

In some embodiments, a single substrate member 33 may include a plurality of substrate mounted enclosures 37 which may enclose different ones of the one or more circuits 33c. This may enable, for example, specific substrate mounted enclosures 37 to be provided for specific circuits 33c—e.g. one circuit 33c may require heat shielding and another may require shielding from physical shock and/or another may require a different level of protection from the ingress of fluid into the enclosure volume 38. The or each enclosure wall 37b and/or the or each enclosure lid 37a may be formed from a metal (or different metals with respect to each other). The or each enclosure wall 37b and/or the or each enclosure lid 37a may be formed from a ceramic material.

When used in this specification and claims, the terms "comprises" and "comprising" and variations thereof mean that the specified features, steps or integers are included. The terms are not to be interpreted to exclude the presence of other features, steps or components. The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the disclosure in diverse forms thereof.

The invention claimed is:

1. Downhole equipment circuitry, comprising:
    a first substrate member including one or more circuits;
    a second substrate member including one or more circuits; and
    a flexible circuit, wherein:
        the first and second substrate members are separate substrate members;
        the flexible circuit is of a laminated construction with a plurality of layers, wherein the flexible circuit is of a rigid-flexible type such that at least one rigid portion of the flexible circuit has at least one rigid layer that is mounted with respect to the first or second substrate members; and
        the flexible circuit provides electrical communication between the one or more circuits of the first substrate member and the one or more circuits for the second substrate member.

2. The downhole equipment circuitry according to claim 1, further comprising:
    a first support member and a second support member, wherein the first substrate member is mounted to the first support member and the second substrate member is mounted to the second support member.

3. The downhole equipment circuitry according to claim 2, wherein the at least one rigid portion includes a rigid portion mounted on the first or second support member.

4. The downhole equipment circuitry according to claim 1, wherein the at least one rigid portion includes a rigid portion mounted adjacent the first or second substrate member.

5. The downhole equipment circuitry according to claim 3, wherein the flexible circuit is wire bonded to at least one of the first or second substrate members.

6. The downhole equipment circuitry according to claim 2, wherein the support member is a wall of a housing.

7. The downhole equipment circuitry according to claim 1, wherein at least part of the one or more circuits of the first or second substrate members is substantially sealed.

8. The downhole equipment circuitry according to claim 1, wherein the first or second substrate member is a co-fired ceramic material.

9. Downhole equipment including:
a housing containing downhole equipment circuitry, wherein the downhole equipment circuitry comprises:
a first substrate member including one or more circuits;
a second substrate member including one or more circuits; and
a flexible circuit, wherein:
the first and second substrate members are separate substrate members;
the flexible circuit is of a laminated construction with a plurality of layers, wherein the flexible circuit is of a rigid-flexible type such that at least one rigid portion of the flexible circuit has at least one rigid layer that is mounted with respect to the first or second substrate members; and
the flexible circuit provides electrical communication between the one or more circuits of the first substrate member and the one or more circuits for the second substrate member.

10. The downhole equipment according to claim 9, wherein the downhole equipment is a tool.

11. The downhole equipment according to claim 9, wherein the first and second substrate members are mounted in the housing such that each substrate member extends primarily through a different plane to the other substrate member.

12. The downhole equipment according to claim 11, wherein each substrate member faces at least part of the other substrate member.

13. The downhole equipment circuitry of claim 2, wherein the first and second support members are spaced apart and the flexible circuit partially overlaps each of the first and second support members.

* * * * *